United States Patent
Sun et al.

(10) Patent No.: US 12,368,795 B2
(45) Date of Patent: Jul. 22, 2025

(54) ELECTRONIC DEVICE

(71) Applicant: Honor Device Co., Ltd., Shenzhen (CN)

(72) Inventors: Qiao Sun, Shenzhen (CN); Kun Li, Shenzhen (CN); Silei Huyan, Shenzhen (CN); Mao Ye, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 406 days.

(21) Appl. No.: 18/001,753

(22) PCT Filed: Aug. 25, 2021

(86) PCT No.: PCT/CN2021/114443
§ 371 (c)(1),
(2) Date: Dec. 14, 2022

(87) PCT Pub. No.: WO2022/127175
PCT Pub. Date: Jun. 23, 2022

(65) Prior Publication Data
US 2023/0232587 A1    Jul. 20, 2023

(30) Foreign Application Priority Data
Dec. 15, 2020 (CN) ............ 202023019475.5

(51) Int. Cl.
*H05K 7/20* (2006.01)
*H01Q 1/02* (2006.01)
*H04M 1/02* (2006.01)

(52) U.S. Cl.
CPC ............ *H05K 7/2039* (2013.01); *H01Q 1/02* (2013.01); *H04M 1/0277* (2013.01)

(58) Field of Classification Search
CPC ...... H05K 7/2039; H01Q 1/02; H04M 1/0277
See application file for complete search history.

(56) References Cited

U.S. PATENT DOCUMENTS

| | | |
|---|---|---|
| 2016/0064820 A1 | 3/2016 | Kim et al. |
| 2018/0342784 A1 | 11/2018 | Samardzija et al. |
| 2021/0183797 A1* | 6/2021 | Vincent ............... H01P 11/002 |

FOREIGN PATENT DOCUMENTS

| | | |
|---|---|---|
| CN | 101031197 A | 9/2007 |
| CN | 107249283 A | 10/2017 |
| CN | 111525227 A | 8/2020 |
| CN | 112055507 A | 12/2020 |
| CN | 112739174 A | 4/2021 |

(Continued)

*Primary Examiner* — Curtis B Odom
(74) *Attorney, Agent, or Firm* — Conley Rose, P.C.

(57) ABSTRACT

Embodiments of this application provide an electronic device, in which a heat sink in the electronic device is multiplexed as a heat dissipation component and a radiator of an antenna. The heat sink provided by the embodiments of this application can be used as a heat dissipation component to distribute heat evenly, such as to cool down an overheated electronic element. In addition, the heat sink can be used as a radiator of an antenna to form an antenna unit with a feed unit and generate radiation to the outside. The heat sink in a first region can be used as a main radiator of the antenna unit to meet the demand for the number of antennas in a 5G wireless communication system, and can also be applied to other communication systems.

20 Claims, 12 Drawing Sheets

(56) References Cited

FOREIGN PATENT DOCUMENTS

| | | | |
|---|---|---|---|
| CN | 112909475 | A | 6/2021 |
| CN | 113140884 | A | 7/2021 |
| KR | 20070065037 | A | 6/2007 |

\* cited by examiner 2.64 GHz 3.5 GHz

4 GHz 4.7 GHz

ELECTRONIC DEVICE

CROSS-REFERENCE TO RELATED APPLICATIONS

This application is a U.S. National Stage of International Application No. PCT/CN2021/114443 filed on Aug. 25, 2021, which claims priority to Chinese Patent Application No. 202023019475.5 filed with the China National Intellectual Property Administration on Dec. 15, 2020, both of which are incorporated herein by reference in their entireties.

TECHNICAL FIELD

This application relates to the field of wireless communication, and in particular, to an electronic device.

BACKGROUND

With the rapid development of wireless communication technology, conventionally, the second generation (second generation, 2G) mobile communication system mainly supports the call function, and an electronic device is only a tool for people to send and receive text messages and perform voice communication. The speed of the wireless Internet access function is extremely slow because data transmission is performed by using a voice channel. Nowadays, in addition to calling, sending text messages, and taking photos, the electronic device can also be used for listening to music online, watching online videos, making real-time video calls, and the like, which covers various applications in people's lives such as calling, movie and entertainment, and e-commerce. Among them, a variety of functional applications require a wireless network to upload and download data, and thus high-speed data transmission becomes extremely important.

With the increasing demand for high-speed data transmission, the development trend of industrial design (industrial design, ID) of the electronic device is a high screen-to-body ratio and multi-camera, which results in a significant reduction in antenna clearance and an increasingly restricted layout space. In addition, many new communication specifications emerge, requiring more antennas to be placed in a mobile phone. The 5th generation (5th generation, 5G) wireless communication system also has an increasing demand for the number of antennas.

SUMMARY

This application provides an electronic device, which solves the problem of mutual influence between a heat dissipation component and a patch antenna in the electronic device by multiplexing a heat sink in the electronic device.

According to a first aspect, an electronic device is provided, including: a heat sink, a first feed unit, a printed circuit board PCB, a middle frame, and a rear cover, where the PCB is arranged in a space enclosed by the middle frame and the rear cover; part of the heat sink is arranged between the PCB and the rear cover; and the heat sink is provided with a first feed point, and the first feed unit is electrically connected to the heat sink at the first feed point.

According to this embodiment of this application, the heat sink can be used as a heat dissipation component to distribute heat evenly, so as to achieve the purpose of cooling down an overheated electronic element. In addition, the heat sink can be used as a radiator of an antenna to form an antenna unit with the feed unit and generate radiation to the outside. The heat sink in a first region can be used as a main radiator of the antenna unit meet the demand for the number of antennas in a 5G wireless communication system, and can also be applied to other communication systems.

With reference to the first aspect, in some implementations of the first aspect, the electronic device further includes: a battery, where the battery is arranged in the space enclosed by the middle frame and the rear cover; and the part of the heat sink is arranged between the battery and the rear cover.

According to this embodiment of this application, one part of the heat sink may be arranged above a heat source, and the other part may be arranged in a low-temperature region to achieve the purpose of heat dissipation, or the part of the heat sink may not be arranged between the battery and the rear cover. A placement position of the heat sink can be adjusted according to an actual layout in the electronic device, which is not limited in this application.

With reference to the first aspect, in some implementations of the first aspect, the electronic device further includes a second feed unit, where the heat sink is provided with a second feed point, and the second feed unit is electrically connected to the heat sink at the second feed point.

According to this embodiment of this application, the first feed unit and the heat sink form a first antenna unit, the second feed unit and the heat sink form a second antenna unit, and the heat sink can be shared as a radiator of an antenna.

With reference to the first aspect, in some implementations of the first aspect, the electronic device further includes a ground, where the heat sink is provided with a first ground point, and the heat sink is electrically connected to the ground at the first ground point.

According to this embodiment of this application, by arranging the ground point on the heat sink, a current direction on the heat sink can be effectively changed, thereby affecting a radiation characteristic of the antenna unit formed by the heat sink.

With reference to the first aspect, in some implementations of the first aspect, that the heat sink is electrically connected to the ground at the first ground point includes: the heat sink is directly connected to or indirectly coupled to the ground at the first ground point.

According to this embodiment of this application, different grounding manners can be flexibly selected according to a spatial layout in the electronic device.

With reference to the first aspect, in some implementations of the first aspect, the heat sink is provided with a gap.

According to this embodiment of this application, by arranging the gap on the heat sink, a current path can be blocked to change the current direction on the heat sink, thereby affecting the radiation characteristic of the antenna unit formed by the heat sink.

With reference to the first aspect, in some implementations of the first aspect, the gap is an open gap or a closed gap.

According to this embodiment of this application, a dimension, position, and number of the gap can be adjusted according to actual design or production requirements.

With reference to the first aspect, in some implementations of the first aspect, the electronic device further includes a metal member, where the metal member is arranged above the heat sink.

According to this embodiment of this application, the current direction on the heat sink is changed in a manner of indirectly coupling the metal member, thereby affecting the radiation characteristic of the antenna unit formed by the heat sink.

With reference to the first aspect, in some implementations of the first aspect, that the metal member is arranged above the heat sink includes: the metal member is arranged between the heat sink and the PCB, or between the heat sink and the battery, or between the heat sink and the rear cover, or on a surface of the rear cover away from the heat sink.

According to this embodiment of this application, the metal member can be flexibly arranged in different positions according to the spatial layout in the electronic device.

With reference to the first aspect, in some implementations of the first aspect, that the first feed unit is electrically connected to the heat sink at the first feed point includes: the first feed unit is directly connected to or indirectly coupled to the heat sink at the first feed point.

According to this embodiment of this application, different feeding manners can be flexibly selected according to the spatial layout in the electronic device.

With reference to the first aspect, in some implementations of the first aspect, the electronic device may further include a coupling member; where the first teed unit is electrically connected to the coupling member, and the coupling member provides indirect coupling feeding at the first feed point for an antenna unit formed by the first feed unit and the heat sink.

According to this embodiment of this application, the coupling member can be implemented in a manner of laser-direct-structuring, flexible printed circuit printing, or using floating metal.

DESCRIPTION OF EMBODIMENTS

The following describes technical solutions of this application with reference to accompanying drawings.

It is to be understood that, in this application, "electrical connection" can be understood as physical contact and electrical conduction between components; and can also be understood as a form in which different components in a circuit construction are connected through physical circuits that can transmit an electrical signal, such as copper foil of a printed circuit board (printed circuit board, PCB), or wires. "Communication connection" may refer to transmission of the electrical signal, including wireless communication connection and wired communication connection. The wireless communication connection does not require a physical medium, and is not a connection relationship that defines a product construction. Both "connected to" and "connected with" may refer to a mechanical connection relationship or physical connection relationship, that is, that A is connected to B or that A is connected with B may refer to the fact that there is a fastened component between A and B (such as a screw, a bolt, and a rivet), or the fact that A and B are in contact with each other and A and B are difficult to be separated.

The technical solutions provided in this application are applicable to an electronic device using one or more of the following communication technologies: blue tooth (blue tooth, BT) communication technology, global positioning system (global positioning system, GPS) communication technology, wireless fidelity (wireless fidelity, WiFi) communication technology, communication technology of global system for mobile communications (global system for mobile communications, GSM), wideband code division multiple access (wideband code division multiple access, WCDMA) communication technology, long term evolution (long term evolution, LTE) communication technology, 5G communication technology, and other communication technologies in the future. The electronic device in embodiments of this application may be a mobile phone, a tablet computer, a notebook computer, a smart bracelet, a smart watch, a smart helmet, smart glasses, and the like. The electronic device may alternatively be a cellular phone, a cordless phone, a session initiation protocol (session initiation protocol, SIP) phone, a wireless local loop (wireless local loop, WLL) station, a personal digital assistant (personal digital assistant, PDA), a handheld device having a wireless communication function, a computing device or another processing device connected to a wireless modem, an in-vehicle device, an electronic device in a 5G network, an electronic device in a future evolved public land mobile network (public land mobile network, PLMN), or the like, which is not limited in the embodiments of this application.

Figure 1:
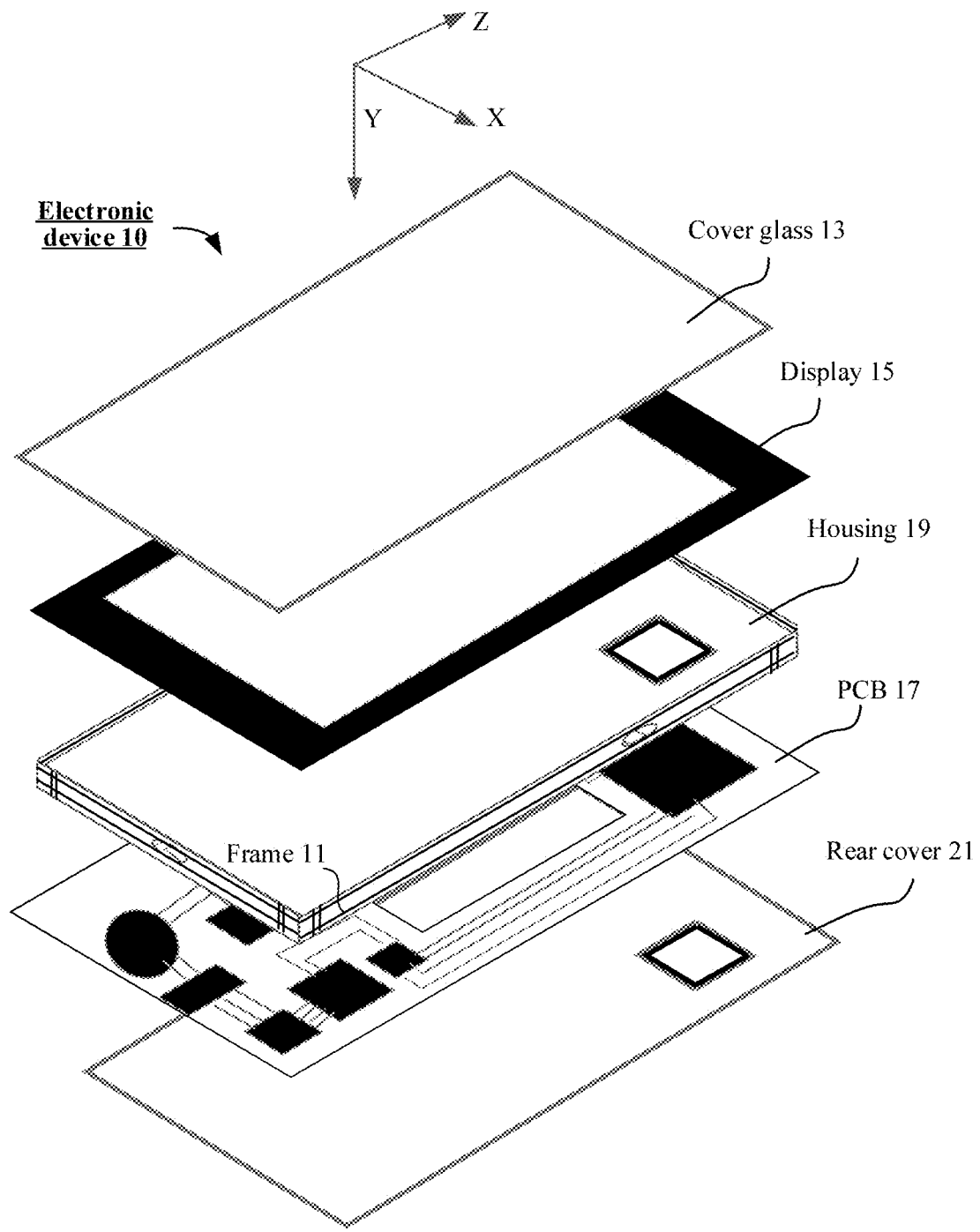
FIG. 1 is a schematic diagram of an electronic device according to an embodiment of this application.

For example, FIG. 1 shows an internal environment of the electronic device provided in this application, and the description is provided using a mobile phone as the electronic device.

As shown in FIG. 1, an electronic device 10 may include: a cover glass (cover glass) 13, a display (display) 15, a printed circuit board (printed circuit board, PCB) 17, a middle frame (middle frame) 19, and a rear cover (rear cover) 21, The cover glass 13 may be arranged close to the display 15, and may be mainly configured to protect and dustproofing the display 15.

Optionally, the display 15 may be a liquid crystal display (liquid crystal display. LCD), a light emitting diode (light emitting diode, LED), an organic light-emitting diode (organic light-emitting diode, OLED), or the like, which is not limited in this application.

The primed circuit board PCB 17 may use a flame-resistant material (FR-4) dielectric board, a Rogers (Rogers) dielectric board, a mixed dielectric hoard of Rogers and FR-4, or the like. FR-4 is a code name for a flame-resistant material grade, and the Rogers dielectric board is a high-frequency board. A metal layer can be arranged on a side of the printed circuit board PCB 17 close to the middle frame 19, and the metal layer can be formed through etching metal on a surface of the PCB 17. The metal layer can be configured to ground electronic components carried on the printed circuit board PCB 17 to prevent electrical shock to a user or damage to the device. The metal layer may be referred to as a PCB ground. Not limited to the PCB ground, the electronic device 10 can further have another ground for grounding, such as a metal middle frame or another metal plane in the electronic device. In addition, multiple electronic components are arranged on the PCB 17. The multiple electronic components include one or more of a processor, a power management module, a memory, a sensor, a SIM card interface, and the like, and these electronic components are also provided with metal inside or on a surface.

The electronic device 10 may further include a battery, which is not shown herein. The battery may be arranged in the middle frame 19, and the battery may separate the PCB 17 into a main board and a sub-board. The main board may be arranged between a frame 11 of the middle frame 19 and an upper edge of the battery, and the sub-board may be arranged between the middle frame 19 and a lower edge of the battery. The battery may also be provided with a metal layer inside or on a surface.

The middle frame 19 mainly plays a supporting role of the whole device. The middle frame 19 may include the frame 11, and the frame 11 may be formed by a conductive material such as metal. The frame 11 may extend around an outer periphery of the electronic device 10 and the display 15. Specifically, the frame 11 may surround four sides of the display 15 to help fix the display 15. In an implementation, the frame 11 made of a metal material can be directly used as a metal frame of the electronic device 10 to form an appearance of the metal frame, which is suitable for metal industrial design (industrial design, ID). In another implementation, an outer surface of the frame 11 may alternatively be made of a non-metal material, and may be, for example, a plastic frame to form an appearance of a non-metal frame, which is suitable for non-metal ID.

The rear cover 21 may be a rear cover made of a metal material, or may be a rear cover made of a non-conductive material, such as a glass rear cover, a plastic rear cover, or another non-metal rear cover.

FIG. 1 only schematically shows some components included in the electronic device 10. The actual shapes, actual dimensions, and actual constructions of these components are not limited in FIG. 1. In addition, the electronic device 10 may further include elements such as a camera and a sensor.

It is to be understood that, in this application, it can be considered that a surface on which the display of the electronic device is located is a front surface, a surface on which the rear cover is located is a back surface, and a surface on which the frame is located is a side surface.

Figure 2:
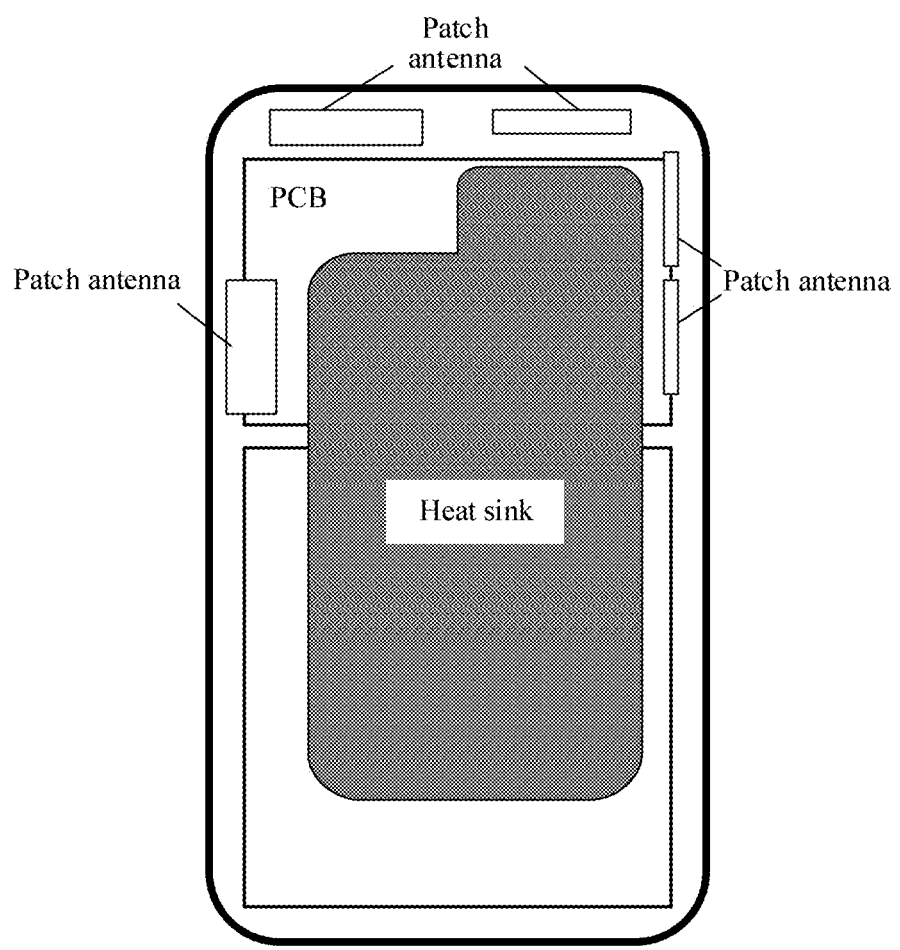
FIG. 2 is a schematic diagram of relative positions of a heat sink and patch antennas in an electronic device according to an embodiment of this application.

With the development of the 5G wireless communication system, the demand for the number of antennas greatly increases, and an antenna is required to be arranged on the back surface of the electronic device as shown in FIG. 2. The antenna arranged on the back surface of the electronic device is usually a patch (patch) antenna. In order not to affect radiation performance of the antenna, the rear cover of the electronic device begins to evolve towards a non-metal direction. However, power consumption of a chip corresponding to the 5G wireless communication system is about 2.5 times that of 4G, and the power consumption and heat generation amount during working rises sharply. Because the rear cover of the electronic device is non-metal, the heat dissipation effect is not good, and additional heat dissipation design is required. As shown in FIG. 2, the heat generated by a high-temperature region (a region of the PCB where the chip is located) is transferred to a low-temperature region (a region where the battery is located) through the heat sink, so that the heat is evenly distributed.

It is to be understood that, for the patch antenna, a relatively large area is usually required to achieve relatively high over the air (over the air, OTA) performance and a relatively low electromagnetic wave specific absorption rate (specific absorption rate. SAR). However, due to a large area of the heat sink, the heat sink basically occupies most of the space of the back surface of the electronic device. The heat sink is usually made of materials such as graphite with high electrical conductivity. In a case that the heat sink overlaps with the patch antenna, the performance of the antenna is to be greatly affected.

The embodiments of this application provide an antenna structure that can implement both a radiation characteristic of the antenna and heat dissipation performance of the heat sink, which effectively solves the contradiction between the two.

Figure 3:
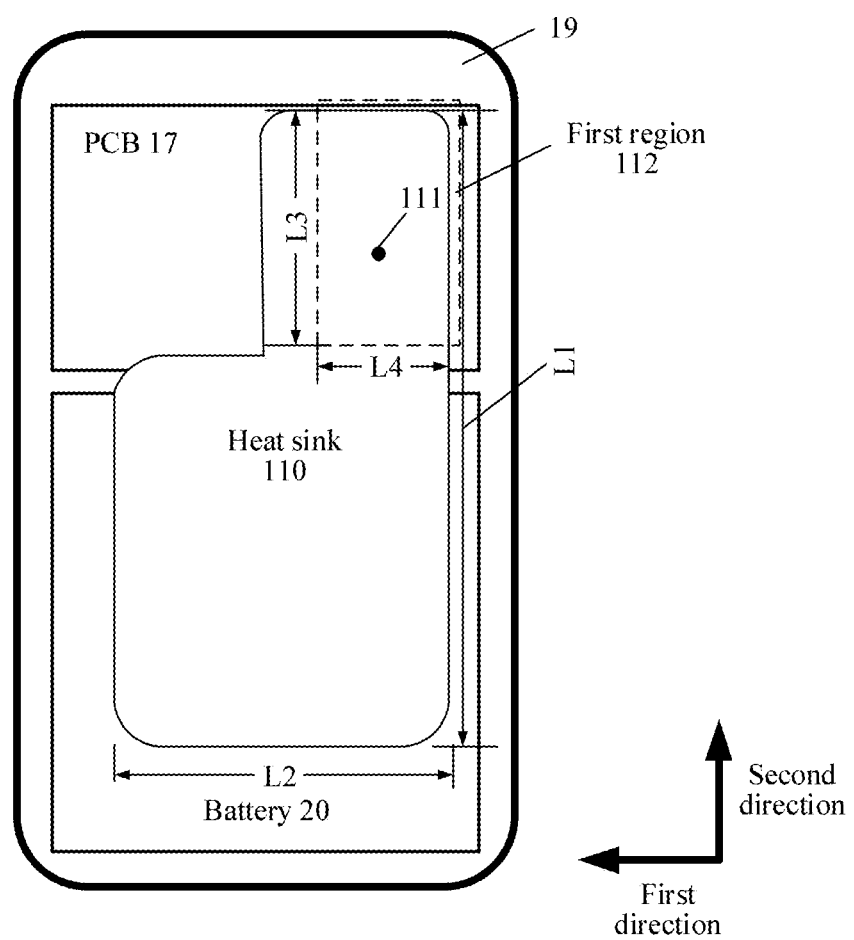
FIG. 3 is a schematic structural diagram of an electronic device according to an embodiment of this application.
Figure 4:
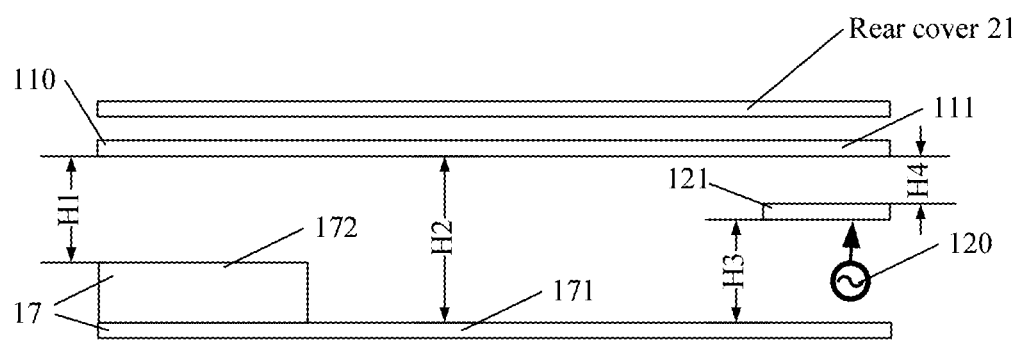
FIG. 4 is a schematic diagram of a cross section of a first region along a first direction.
Figure 5:
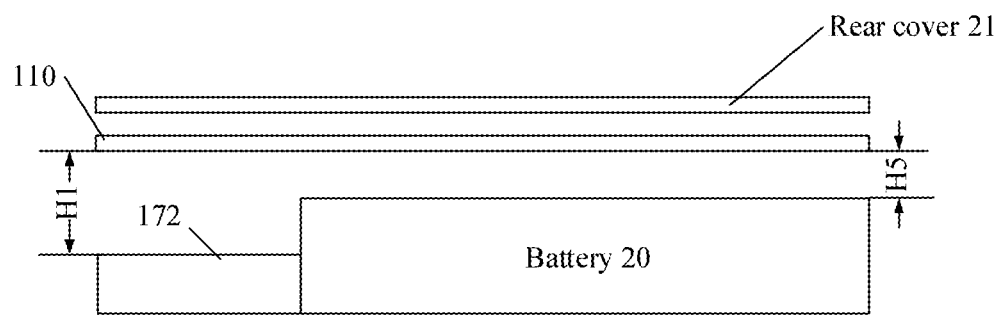
FIG. 5 is a schematic diagram of a cross section of the heat sink along a second direction.

FIG. 3 to FIG. 5 are schematic structural diagrams of an electronic device according to an embodiment of this application. FIG. 3 is a schematic structural diagram of an electronic device according to an embodiment of this application. FIG. 4 is a schematic diagram of a cross section of a first region along a first direction. FIG. is a schematic diagram of a cross section of the heat sink along a second direction.

As shown in FIG. 3, the electronic device may include a heat sink 110, the PCB 17, a battery 20, and the middle frame 19. The PCB 17 and the battery 20 may be arranged in a region enclosed by the middle frame 19, one part of the heat sink 110 may be arranged above the PCB 17, and the other part of the heat sink 110 may be arranged above the battery 20. A feed point 111 may be arranged in a first region 112 of the heat sink 110, and a feed unit 120 in the electronic device may be electrically connected to the heat sink at the feed point 111.

It is to be understood that, the heat sink 110 can distribute the heat in the electronic device evenly. Therefore, one part of the heat sink may be arranged above a heat source (the electronic elements on the PCB) and the other part may be arranged in a low-temperature region, to achieve the purpose of heat dissipation, or the part of heat sink may not be arranged between the battery 20 and the rear cover 21. A placement position of the heat sink can be adjusted according to an actual layout in the electronic device, which is not limited in this application.

As shown in FIG. 4, the electronic device may further include the feed unit and the rear cover 21. The part of the heat sink 110 is arranged between the PCB and the rear cover 21. As shown in FIG. 5, the part of the heat sink 110 is arranged between the battery 20 and the rear cover 21. The first direction may be a direction in which a short side of the frame of the electronic device is located. The second direction may be a direction in which a long side of the frame of the electronic device is located.

It is to be understood that, this embodiment of this application solves the problem of mutual influence between a heat dissipation component and the patch antenna in the electronic device by multiplexing the heat sink 110. The heat sink 110 provided by this embodiment of this application may be used as the heat dissipation component to transfer the heat generated by the high-temperature region (the region on the PCB where the chip is located) to the low-temperature region (the region where the battery is located) to distribute the heat evenly, thereby achieving the purpose of cooling down an overheated electronic element. In addition, the heat sink 110 can be used as a radiator of the antenna, to form an antenna, unit with the feed unit and generate radiation to the outside. The heat sink 110 in the first region 112 can be used as a main radiator of the antenna unit to meet the demand for the number of antennas in the 5G wireless communication system, and can also be applied to other communication systems.

Optionally, the electronic device may further include a coupling member 121. The feed unit 120 may be electrically connected to the coupling member 121, and provide indirect coupling feeding for the antenna unit at the feed point 111. Alternatively, the feed unit 120 may be connected to the heat sink 110 at the feed point 111, and directly feed the antenna unit.

It is to be understood that, indirect coupling is a concept relative to direct coupling, that is, over-the-air coupling, and there is no direct electrical connection between two components. Direct coupling is a direct electrical connection, in which power is fed directly at the feed point.

Optionally, the coupling member 121 may be implemented in the manner of laser-direct-structuring (laser-direct-structuring, LDS), flexible printed circuit (flexible printed circuit. FPC) printing, or using floating metal (floating metal, FIAT).

Optionally, as shown in FIG. 3, a dimension of the heat sink 110 can be adjusted according to actual production or design. In this embodiment of this application, a diagram of a simulation result in the flowing is illustrated by using an example in which a length L1 of the heat sink 110 is 98 mm and a width L2 of the heat sink 110 is 65 mm, while the specific dimension of the heat sink 110 is not limited.

Optionally, as shown in FIG. 3, the dimension of the first region 112 of the heat sink 110 can be adjusted according to the actual production and design. In this embodiment of this application, a diagram of a simulation result in the following is illustrated by using an example in which a length L3 of the first region 112 of the heat sink 110 is 24 rum and a width L4 of the first region 112 of the heat sink 110 is 16 mm, while the specific dimension of the heat sink 110 is not limited. In addition, a position of the first region 112 of the heat sink 110 can also be adjusted. In this embodiment of this application, the first region 112 is located in a boundary region of two sides of the heat sink 110 as an example. Alternatively, the first region 112 can be located in other positions of the heat sink 110, such as a center region.

Optionally, as shown in FIG. 4, the PCB 17 may include a shielding cover and a metal layer 171. The metal layer 171 may be used as the ground (ground, GND) of the antenna unit, and the shielding cover 172 is electrically connected to the metal layer 171, and is configured to prevent the electronic element in the shielding cover 172 from external electromagnetic interference.

Optionally, as shown in FIG. 4 and FIG. 5, a distance H1 between the shielding cover 172 and the heat sink 110 may be 0.2 mm, a distance H2 between the metal layer 171 and the heat sink 110 may be 0.8 mm, a distance 113 between the coupling member 121 and the metal layer 171 may be 0.65 mm, a distance H4 between the coupling member 121 and the heat sink 110 may be 0.15 mm, and a distance H5 between the heat sink 110 and the battery 20 may be 0.1 mm. It is to be understood that, the foregoing data are only used as an example in the embodiments of this application, and can be adjusted according to the actual production and design.

Optionally, an insulation layer may be arranged on a surface of the heat sink 110 close to the battery 20 to avoid that the heat sink 110 is in directly contact with a metal component to reduce the performance of the antenna unit.

Optionally, the heat sink 110 may be a graphite sheet, a copper sheet, or the like, and also has features of fast heat dissipation and high electrical conductivity.

Figure 6:
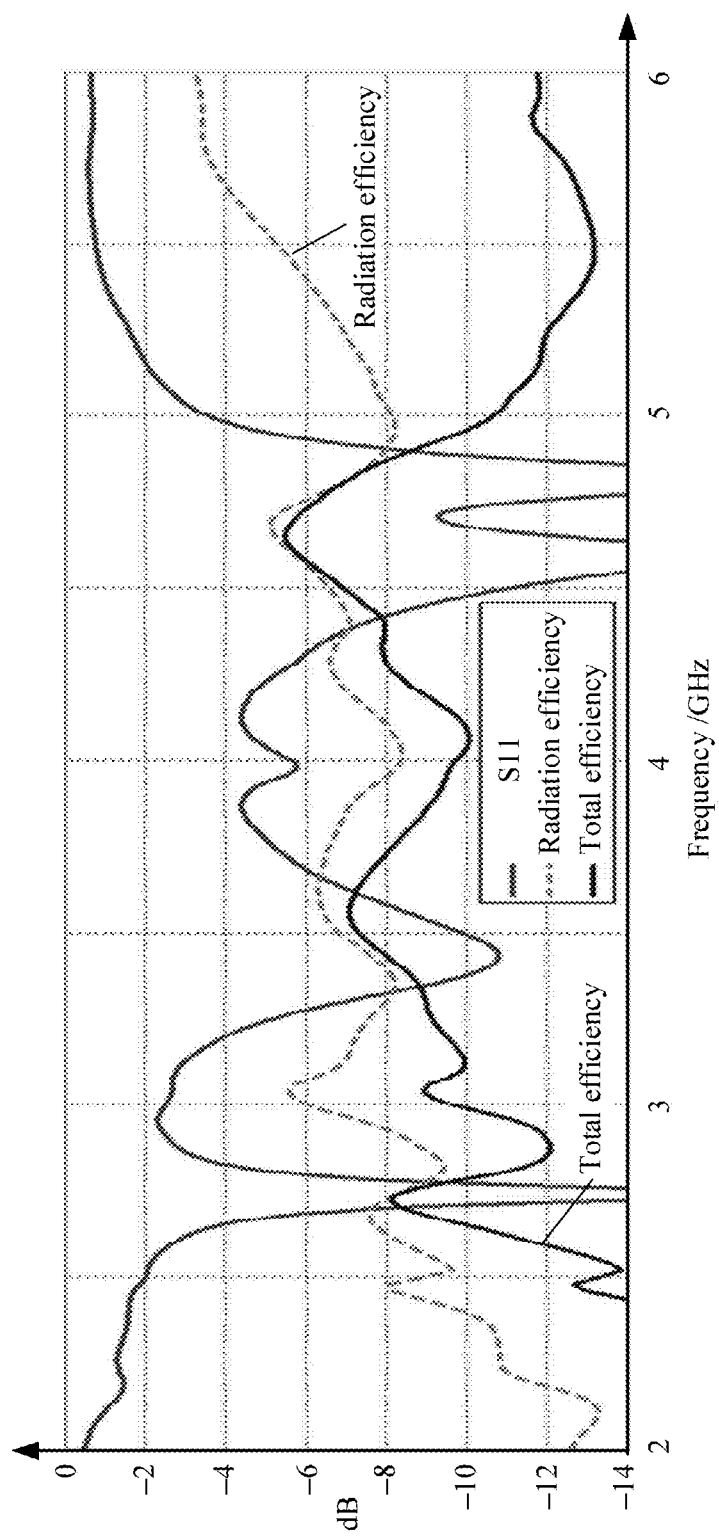
FIG. 6 is a diagram of simulation results of an antenna unit shown in FIG. 3.

FIG. 6 is a diagram of simulation results of the antenna unit shown in FIG. 3. The diagram includes simulation results of S parameter, radiation efficiency (radiation efficiency), and total efficiency (total efficiency).

As shown in FIG. 6, a working frequency band of the antenna unit formed by multiplexing the heat sink provided by this embodiment of this application can cover a frequency band of N41 (2.496 GHz to 2.69 GHz), a frequency band of 177 (3.3 GHz to 4.2 GHz), and a frequency band of 179 (4.4 GHz to 5.0 GHz), in addition, in the working frequency band corresponding to resonance generated by the antenna unit, the radiation efficiency and the total efficiency can also meet the demand.

It is to be understood that, in the technical solutions provided in the embodiments of this application, the heat sink is used as an antenna radiator. However, a radiation area of the heat sink is much larger than a working wavelength corresponding to the lowest working frequency band of the antenna unit.

Figure 7:
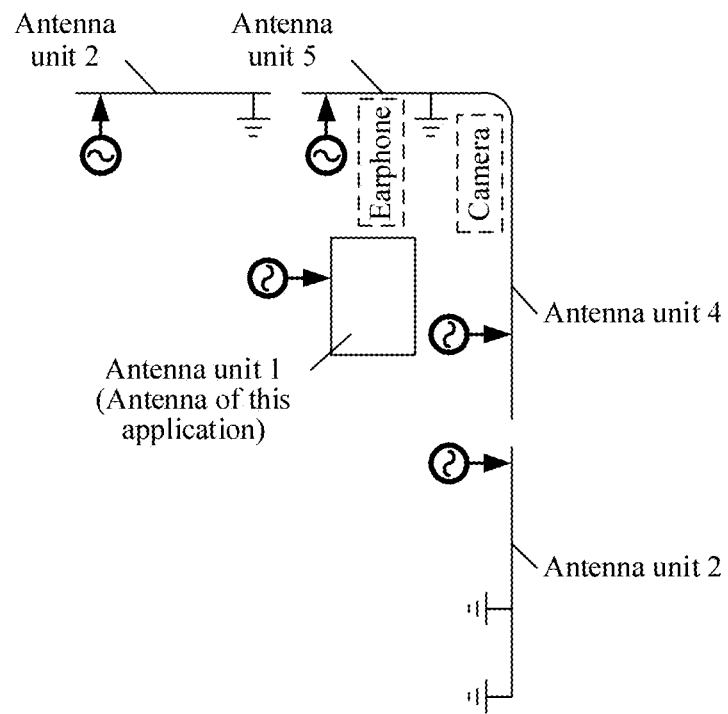
FIG. 7 is a schematic structural diagram of an antenna layout in an electronic device.

FIG. 7 is a schematic structural diagram of an antenna layout in an electronic device.

As shown in FIG. 7, the electronic device may include an antenna unit 1, an antenna unit 2, an antenna unit 3, an antenna unit 4, and an antenna unit 5.

The antenna unit 1 is a solution provided by the embodiments of this application in which the heat sink is used as an antenna radiator. The antenna unit 2, the antenna unit 3, the antenna unit 4, and the antenna unit 5 are common metal frame antennas, Which are only used as an example in this application.

Figure 8:
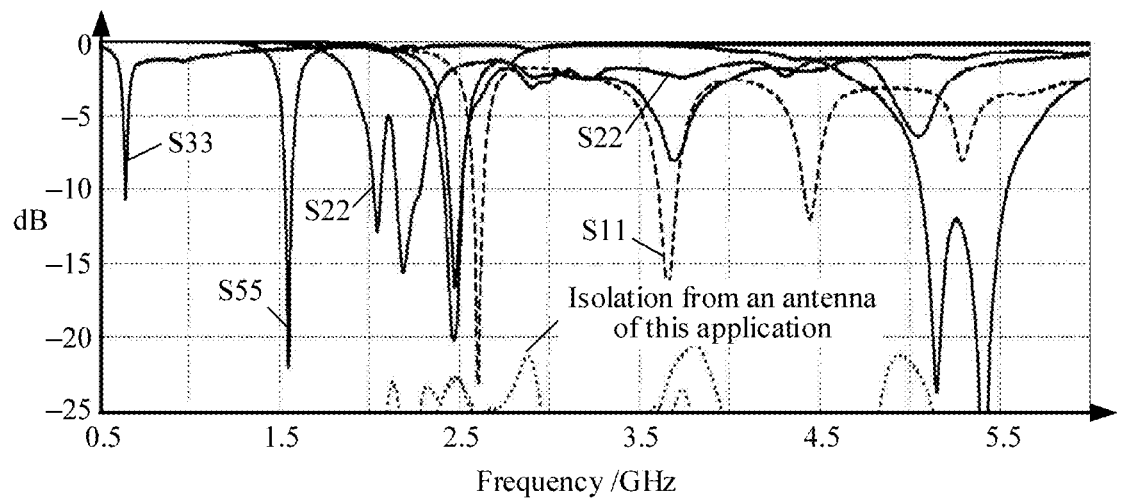
FIG. 8 is a diagram of simulation results among antenna units shown in FIG. 7.

FIG. 8 is a diagram of simulation results among antenna units shown in FIG. 7.

As shown in FIG. 8, S11 is an S parameter corresponding to the antenna unit 1, S22 is an S parameter corresponding to the antenna unit 2, S33 is an S parameter corresponding to the antenna unit 3, S44 is an S parameter corresponding to the antenna unit 4, and S55 is an S parameter corresponding to the antenna unit 5. The antenna unit 1, the antenna unit 2, the antenna unit 3, the antenna unit 4, and the antenna unit 5 can all work in the corresponding working frequency hands, and good isolation can be maintained between the antenna unit 1 and the antenna unit 2, the antenna unit 3, the antenna unit 4, and the antenna unit 5. From the results, the worst isolation is −18 dB.

Figure 9:
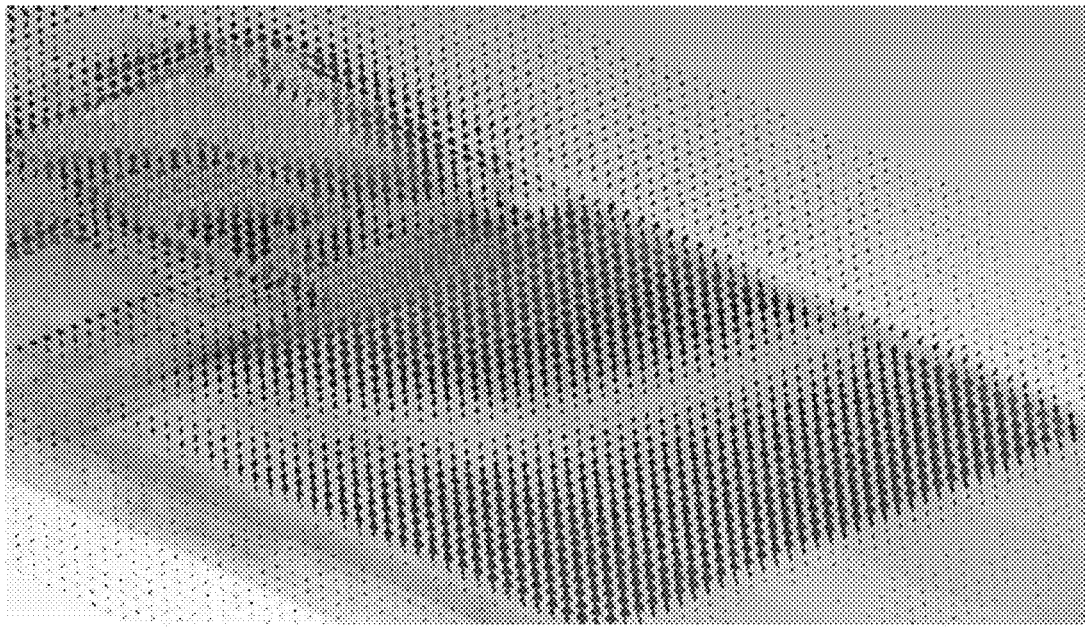
FIG. 9 is a diagram of an electric field distribution corresponding to 2.64 GHz.
Figure 10:
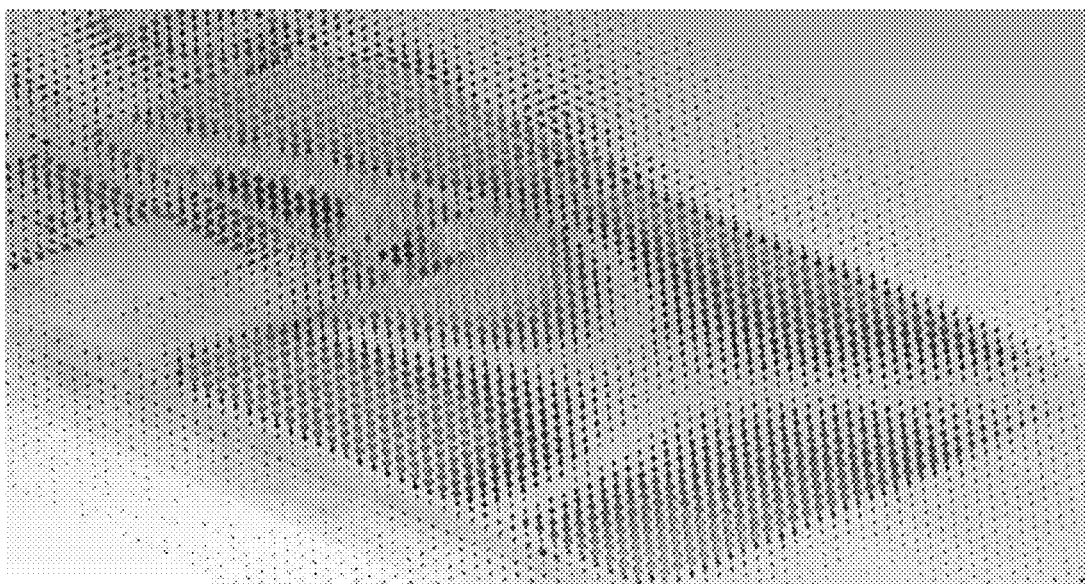
FIG. 10 is a diagram of an electric field distribution corresponding to 3.5 GHz.
Figure 11:
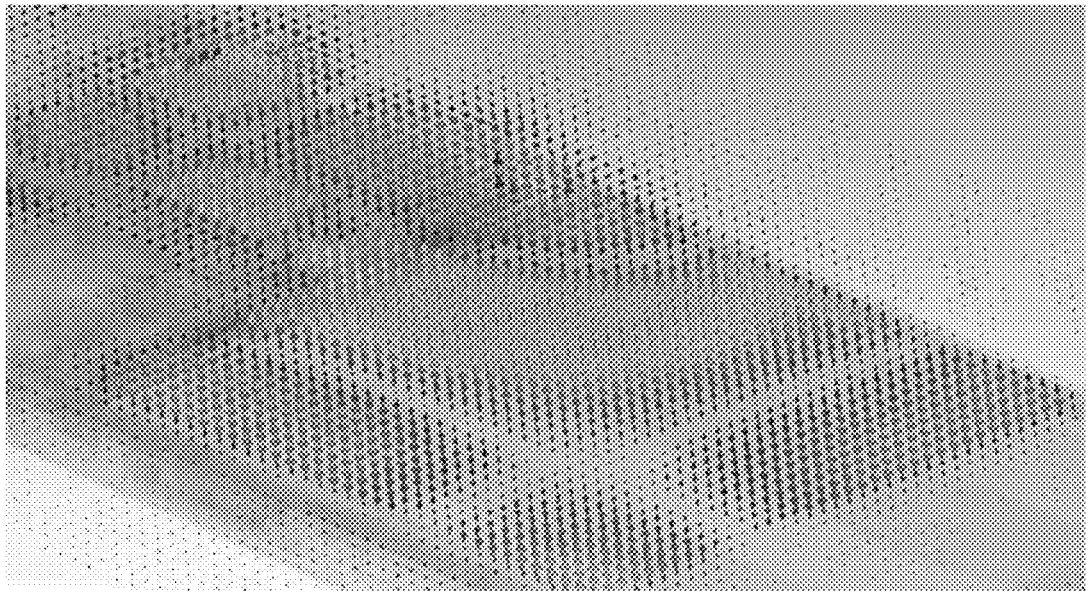
FIG. 11 is a diagram of an electric field distribution corresponding to 4 GHz.
Figure 12:
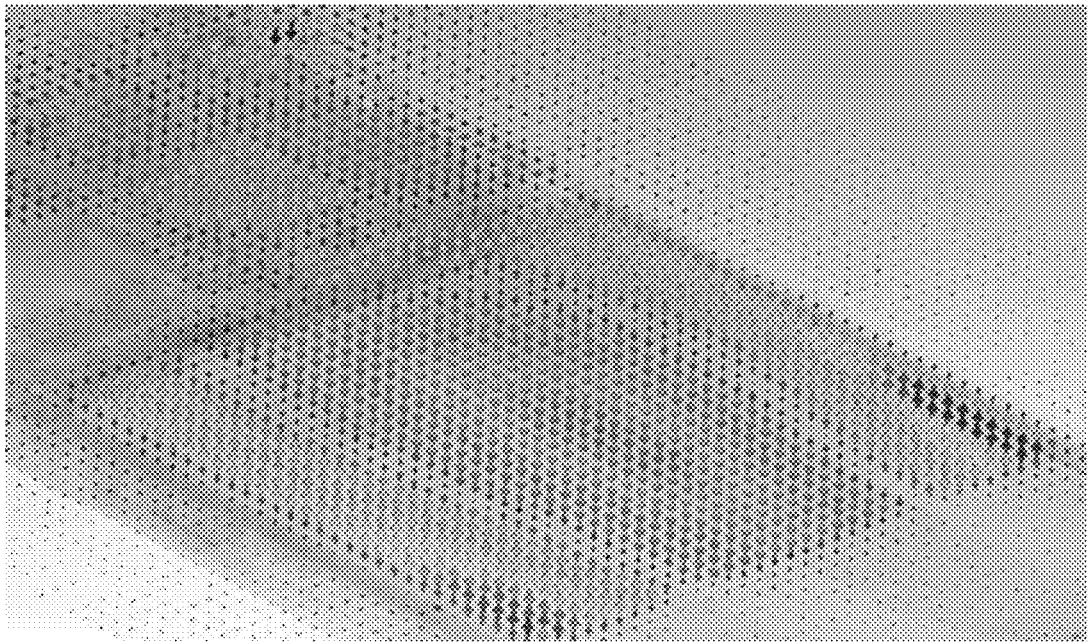
FIG. 12 is a diagram of an electric field, distribution corresponding to 4.7 GHz.

FIG. 9 to FIG. 12 are diagrams of an electric field distribution of the antenna unit shown in FIG. 3. FIG. 9 is a diagram of an electric field distribution corresponding to 2.64 GHz. FIG. 10 is a diagram of an electric field distribution corresponding to 3.5 GHz, FIG. 11 is a diagram of an electric field distribution corresponding to 4 GHz. FIG. 12 is a diagram of an electric field distribution corresponding to 4.7 GHz.

As shown in FIG. 9, a resonant mode of the antenna unit at the frequency point 2.64 GHz in the N41 frequency band is a TM01 mode in the first region and the heat sink around the first region, and there is very little electric field distribution on the heat sink in the remaining region.

As shown in FIG. 10, the resonant mode of the antenna unit at the frequency point 3.5 GHz in the N77 frequency band is a TM10 mode in the first region and the heat sink around the first region, and there is very little electric field distribution on the heat sink in the remaining region.

As shown in FIG. 11, the resonant mode of the antenna unit at the frequency point 4 GHz in the N77 frequency band is a TM11 mode of the heat sink in and around the first region, and there is strong electric field distribution on the heat sink along an edge region of the battery in the remaining region.

As shown in FIG. 12, the resonant mode of the antenna unit at the frequency point 4.7 GHz in the N79 frequency band is a TM02 mode of the heat sink in the first region and the heat sink around the first region, and there is electric field distribution of TM20 mode on the heat sink along the edge region of the battery in the remaining region.

Figure 13:
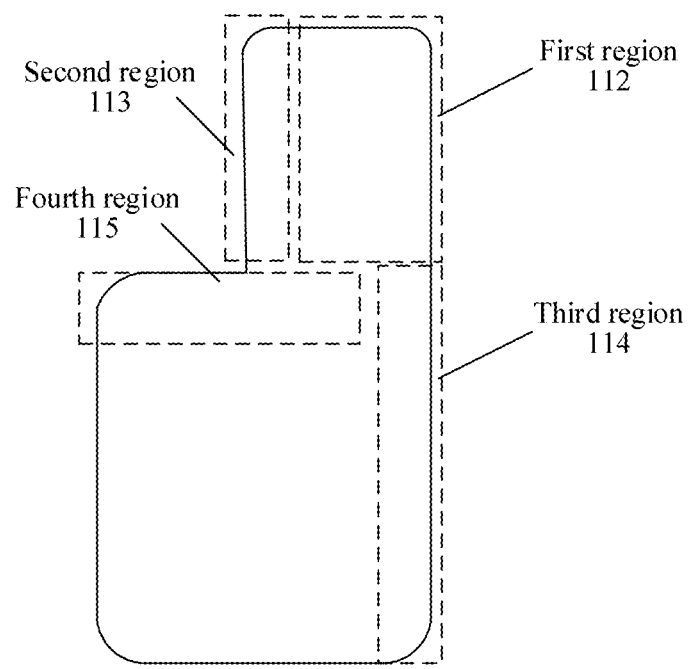
FIG. 13 is a schematic structural diagram of all regions on a heat sink according to an embodiment of this application.

It is to be understood that, as shown in FIG. 13, the heat sink in a second region 112 on the left side of the first region 112 has a great influence on the TM01 mode, which is equivalent to an effect of shunt capacitance, causing the TM01 mode to below. The heat sink has some influence on other modes as well. The heat sink in a third region 114 arranged along the side edge of the battery has a great influence on the TM10 mode and higher-order mode, which is equivalent to the effect of the shunt capacitance, causing the resonance to be low. The heat sink in a fourth region 115 arranged along the upper edge of the battery basically has no radiation effect and has a shunting effect in the TM01/TM10/TM11 mode. The current distribution is relatively strong in the TM02 mode.

Figure 14:
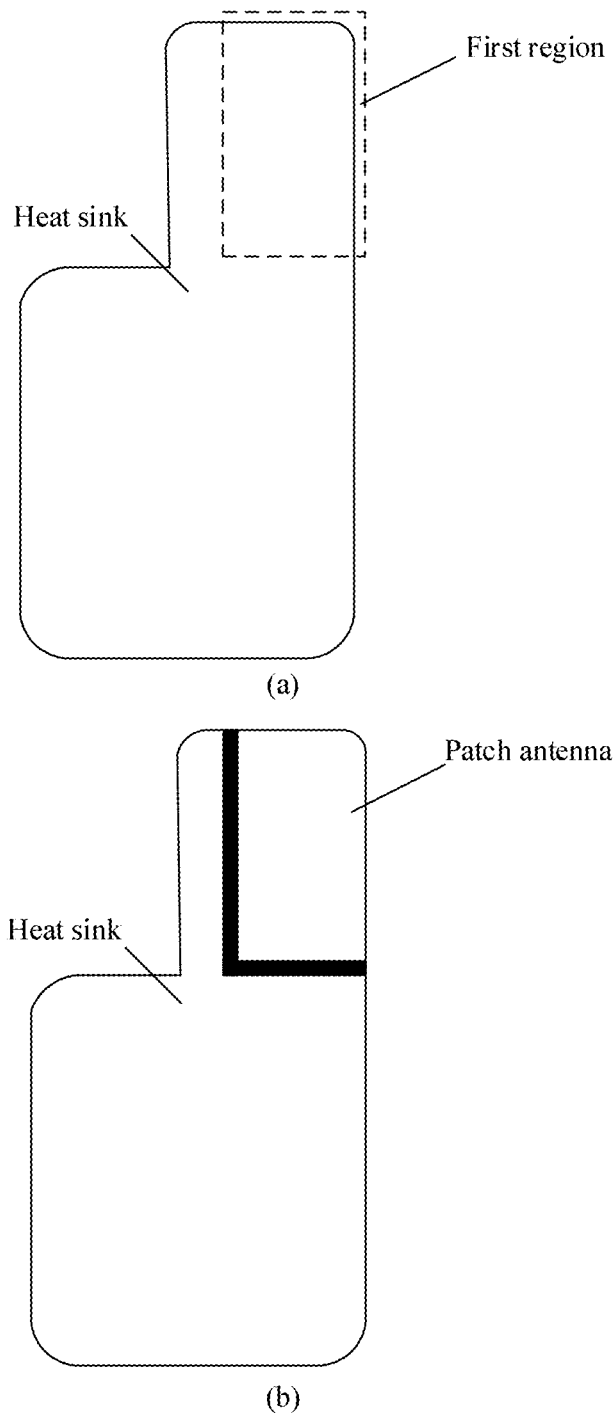
FIG. 14 is a schematic structural diagram of an electronic device according to an embodiment of this application.

FIG. 14 is a schematic structural diagram of an electronic device according to an embodiment of this application.

As shown in FIG. 14(a), in the technical solution provided by this application, the heat sink is used as the antenna radiator. As shown in FIG. 14(b), a technical solution in conventional technology is used as a comparison solution of this application, in which a patch antenna corresponding to the first region is selected, which is not in contact with the heat sink.

As shown in Table 1 below Table 1 shows the SAR value corresponding to back (back) 0 mm and 5 mm of the electronic device in a case that a normalized total radiated power (total radiated power, TRP) of the antenna unit shown in FIG. 14(a) is 19 dB.

TABLE 1

| Technical solution in FIG. 14(a) | | Normalized SAR value | | | |
| --- | --- | --- | --- | --- | --- |
| | | Back 0 mm | | Back 5 mm | |
| Frequency (GHz) | Normalized TRP (dB) | 10 g | 1 g | 10 g | 1 g |
| 2.77 | 19 | 5.1 | 15.4 | 3.5 | 9.3 |
| 3.4 | 19 | 4.6 | 14.3 | 2.8 | 6.9 |

TABLE 1-continued

| Technical solution in FIG. 14(a) | | Normalized SAR value | | | |
| --- | --- | --- | --- | --- | --- |
| | | Back 0 mm | | Back 5 mm | |
| Frequency (GHz) | Normalized TRP (dB) | 10 g | 1 g | 10 g | 1 g |
| 4.6 | 19 | 4.9 | 18.6 | 1.3 | 3.9 |
| 4.9 | 19 | 4.9 | 19 | 1.2 | 3.7 |

As shown in Table 2 below, Table 2 shows the SAR value corresponding to back (back) 0 mm and 5 mm of the electronic device in a case that the normalized TRP of the antenna unit shown in FIG. 14(b) is 19 dB.

TABLE 2

| Technical solution in FIG. 14(b) | | Normalized SAR value | | | |
| --- | --- | --- | --- | --- | --- |
| | | Back 0 mm | | Back 5 mm | |
| Frequency (GHz) | Normalized TRP (dB) | 10 g | 1 g | 10 g | 1 g |
| 3.4 | 19 | 7.1 | 22.2 | 5.1 | 16.3 |
| 3.82 | 19 | 5.2 | 15.7 | 3.3 | 9.3 |
| 4.58 | 19 | 4.9 | 21.8 | 1.4 | 4.6 |
| 5 | 19 | 5.2 | 21.8 | 1.9 | 6.4 |

As shown in the above tables, the technical solution provided by this application has a significantly lower SAR value and better performance compared to the related art. This is because the heat sink outside the first region plays a role of shunting.

As shown in Table 3 below, Table 3 shows the performance of the antenna unit shown in FIG. 14(a) in a hand left (hand left, HL) model, a hand right (hand right, HR) model, a beside head and hand left (beside head and hand left, BHHL) model, and a beside head and hand right (beside head and hand right, BHHR) model.

TABLE 3

| Frequency (GHz) | HR (GHz) | HL (GHz) | BHHR (GHz) | BHHL (GHz) |
| --- | --- | --- | --- | --- |
| 2.65 | −0.4 | −0.7 | −1.2 | −1.7 |
| 3.3 | −0.7 | −0.7 | −1 | −1 |
| 3.8 | −0.5 | −0.5 | −1 | −0.7 |
| 4.2 | −1.5 | −1.5 | −2 | −2.2 |
| 4.5 | −0.5 | −0.5 | −1.5 | −1.5 |
| 5 | −0.5 | −0.5 | −1.3 | −1 |

As shown in Table 4 below, Table 4 shows the performance of the antenna unit shown in FIG. 14(b) in the HL model, the HR model, the BHHL model, and the BHHR model.

TABLE 4

| Frequency (GHz) | HR (GHz) | HL (GHz) | BHHR (GHz) | BHHL (GHz) |
| --- | --- | --- | --- | --- |
| 3.3 | −0.5 | −0.5 | −1 | −0.5 |
| 3.8 | −1.2 | −0.5 | −2 | −1.5 |
| 4.2 | −0.5 | 0.5 | −0.5 | −0.5 |
| 4.5 | −0.5 | −0.3 | −0.5 | −0.5 |
| 5 | −0.5 | −0.5 | −1 | −1 |

As shown in the above tables, the technical solution provided by this application has similar performance to the related art, and the head-hand performance of the technical solution provided by this application does not become poor due to the enlarged antenna radiator.

Figure 15:
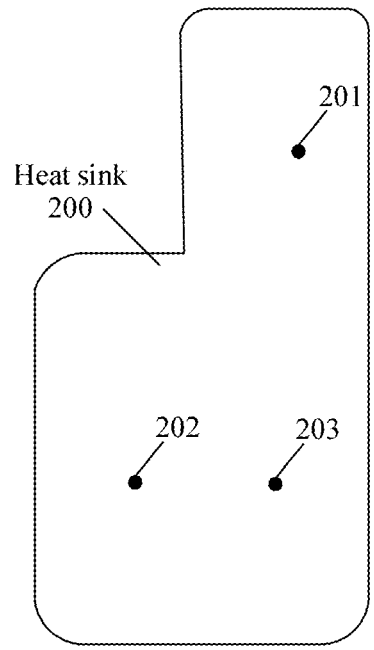
FIG. 15 is a schematic structural diagram of an electronic device according to an embodiment of this application.

FIG. 15 is a schematic structural diagram of an electronic device according to an embodiment of this application.

The electronic device may include a first feed unit, a second feed unit, and a third feed unit.

As shown in FIG. 15, a heat sink 200 may be provided with a first feed point 201, a second feed point 202, and a third feed point 203. The first feed unit may be electrically connected to the heat sink 200 at the first feed point 201. The second feed unit may be electrically connected to the heat sink 200 at the second feed point 202, The third feed unit may be electrically connected to the heat sink 200 at the third feed point 203.

It is to be understood that, the first feed unit and the heat sink form a first antenna unit, the second feed unit and the heat sink form a second antenna unit, and the third feed unit and the heat sink form a third antenna unit. The heat sink is a complete plane, and is not spliced by several parts. The first antenna unit, the second feed unit, and the third antenna unit share the same radiator, but their corresponding main radiation parts are different.

In addition, the number of the feed point can be adjusted according to the actual design or production. This application only takes three feed points as an example, and the specific number of the feed point is not limited in this application.

Figure 16:
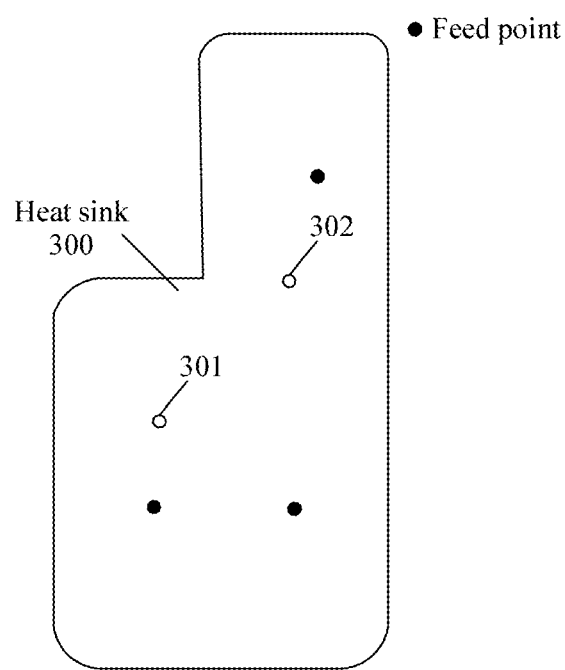
FIG. 16 is a schematic structural diagram of an electronic device according to an embodiment of this application.

FIG. 16 is a schematic structural diagram of an electronic device according to an embodiment of this application.

As shown in FIG. 16, a heat sink 300 may be provided with a first ground point 301 and a second ground point 302. The heat sink 300 may be electrically connected to a ground of the electronic device at the first ground point 301 and the second ground point 302.

Optionally, the ground of the electronic device may be a metal layer in the PCB, the middle frame, or another metal layer of the electronic device.

Optionally, the heat sink may be electrically connected to the ground at the ground point through indirect coupling. Alternatively, the heat sink may be directly connected to the ground at the ground point directly.

It is to be understood that, by arranging the ground point on the heat sink 300, a current direction on the heat sink 300 can be effectively changed, thereby affecting the radiation characteristic of the antenna unit formed by the heat sink. Therefore, the number of the ground point can be adjusted according to the actual design or production. This application only takes two ground points as an example, and the specific number of the ground point is not limited in this application.

Figure 17:
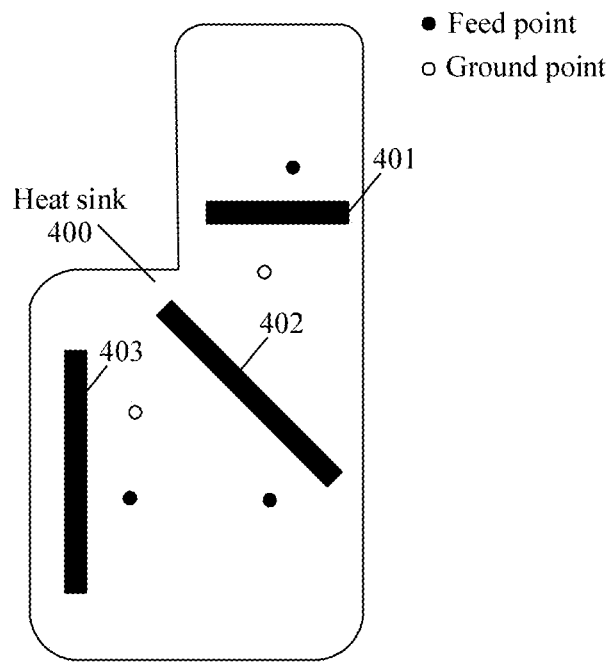
FIG. 17 is a schematic structural diagram of an electronic device according to an embodiment of this application.

FIG. 17 is a schematic structural diagram of an electronic device according to an embodiment of this application.

As shown in FIG. 17, a heat sink 400 may be provided with a first gap 401, a second gap 402, and a third gap 403.

Optionally, the gap on the heat sink 400 may be an open gap, or may, be a Closed gap, which is not limited in this application.

It is to be understood that, by arranging the gap on the heat sink 400, a current path can be blocked to change a current direction on the heat sink 400, thereby affecting the radiation characteristic of the antenna unit formed by the heat sink. Therefore, the dimension, position, and number of the gap can be adjusted according to the actual design or production. This application only takes three gaps as an example, while the specific dimension, position, and number of the gap are not limited in this application.

Figure 18:
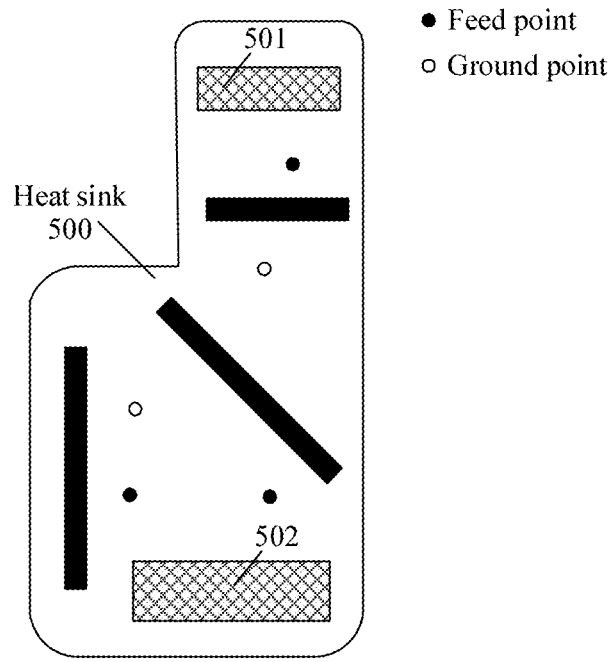
FIG. 18 is a schematic structural diagram of an electronic device according to an embodiment of this application.

FIG. 18 is a schematic structural diagram of an electronic device according to an embodiment of this application.

As shown in FIG. 18, the electronic device may further include a first metal member 501 and a second metal member 502, and the first metal member 501 and the second metal member 502 can be arranged above the heat sink. For example, the first metal member 501 and the second metal member 502 may be arranged between the heat sink and the PCB, or between the heat sink and the battery, or between the heat sink and the rear cover, or on a surface of the rear cover away from the heat sink, that is, at a certain distance from the heat sink in a third direction. The third direction is a direction perpendicular to a plane where the rear cover is located.

It is to be understood that, by arranging the metal member around a heat sink 500, a current direction on the heat sink 500 can be changed through the indirect coupling of the metal member, thereby affecting the radiation characteristic of the antenna unit formed by the heat sink. Therefore, the dimension, position, and number of the metal member can be adjusted according to the actual design or production. This application only takes two metal members as an example, and the specific dimension, position, and number of the metal member is not limited in this application.

A person skilled in the art can clearly understand that for convenience and conciseness of description, the specific working processes of the above-described system, apparatus, and unit can be understood with reference to the corresponding processes in the above-described method embodiments, and details are not repeated herein again.

In the several embodiments provided in this application, it is to be understood that the disclosed system, apparatus, and method may be implemented in other manners. For example, the above-described apparatus embodiment is only exemplary. For example, the division of the units is only a logical function division and may be other divisions during actual implementation. For example, a plurality of units or components may be combined or integrated into another system, or some features may be ignored or not performed. In addition, the shown or discussed mutual couplings or direct couplings or communication connections may be implemented through some interfaces. The indirect couplings or communication connections between the apparatuses or units may be implemented in electronic, mechanical, or other forms.

The foregoing descriptions are merely specific implementations of this application, but are not intended to limit the protection scope of this application. Any variation or replacement readily figured out by a person skilled in the art within the technical scope disclosed in this application shall fall within the protection scope of this application, Therefore, the protection scope of this application shall be subjected to the protection scope of the claims.

What is claimed is:
1. An electronic device, comprising:
   a middle frame;
   a rear cover;
   a printed circuit board (PCB) arranged in a space enclosed by the middle frame and the rear cover;
   a heat sink having at least a portion that is arranged between the PCB and the rear cover, wherein the heat sink comprises a first feed point; and
   a first feed unit that is electrically connected to the heat sink at the first feed point.
2. The electronic device of claim 1, further comprising a battery arranged in the space enclosed by the middle frame and the rear cover, wherein the portion of the heat sink is arranged between the battery and the rear cover.

3. The electronic device of claim 1, further comprising a second feed unit, wherein the heat sink comprises a second feed point, and wherein the second feed unit is electrically connected to the heat sink at the second feed point.

4. The electronic device according to claim 3, further comprising a ground, wherein the heat sink comprises a first ground point, and the heat sink is electrically connected to the ground at the first ground point.

5. The electronic device of claim 4, wherein the heat sink being electrically connected to the ground at the first ground point comprises the heat sink being directly connected to or indirectly coupled to the ground at the first ground point.

6. The electronic device of claim 3, wherein the heat sink comprises a gap.

7. The electronic device of claim 6, wherein the gap is an open gap or a closed gap.

8. The electronic device of claim 2, further comprising a metal member arranged above the heat sink.

9. The electronic device of claim 8, wherein the metal member being arranged above the heat sink comprises the metal member being arranged either a) between the heat sink and the PCB, or b) between the heat sink and the battery, or c) between the heat sink and the rear cover, or d) on a surface of the rear cover away from the heat sink.

10. The electronic device of claim 1, wherein the first feed unit being electrically connected to the heat sink at the first feed point comprises the first feed unit being directly connected to or indirectly coupled to the heat sink at the first feed point.

11. The electronic device of claim 10, further comprising a coupling member, wherein the first feed unit is electrically connected to the coupling member, and the coupling member provides indirect coupling feeding at the first feed point for an antenna unit formed by the first feed unit and the heat sink.

12. An electronic device, comprising:
a middle frame;
a rear cover;
a ground;
a printed circuit board (PCB) arranged in a space enclosed by the middle frame and the rear cover;
a heat sink having at least a portion that is arranged between the PCB and the rear cover, wherein the heat sink comprises a first feed point, at least one gap, and a first ground point, wherein the heat sink is electrically connected to the ground at the first ground point, and wherein the heat sink is made of graphite; and
a first feed unit that is electrically connected to the heat sink at the first feed point.

13. The electronic device of claim 12, wherein the gap is an open gap or a closed gap.

14. The electronic device of claim 12, further comprising a second feed unit, wherein the heat sink comprises a second feed point, and wherein the second feed unit is electrically connected to the heat sink at the second feed point.

15. The electronic device of claim 14, further comprising a third feed unit, wherein the heat sink comprises a third feed point, and wherein the third feed unit is electrically connected to the heat sink at the third feed point.

16. The electronic device according to claim 15, further comprising a battery arranged in the space enclosed by the middle frame and the rear cover, wherein the portion of the heat sink is arranged between the battery and the rear cover.

17. The electronic device of claim 16, further comprising a metal member arranged above the heat sink.

18. The electronic device of claim 17, wherein the metal member being arranged above the heat sink comprises the metal member being arranged either a) between the heat sink and the PCB, or b) between the heat sink and the battery, or c) between the heat sink and the rear cover, or d) on a surface of the rear cover away from the heat sink.

19. The electronic device of claim 12, further comprising a coupling member, wherein the first feed unit is electrically connected to the coupling member, and the coupling member provides indirect coupling feeding at the first feed point for an antenna unit formed by the first feed unit and the heat sink.

20. The electronic device of claim 14, further comprising a coupling member, wherein the second feed unit is electrically connected to the coupling member, and the coupling member provides indirect coupling feeding at the second feed point for an antenna unit formed by the second feed unit and the heat sink.

* * * * *